United States Patent [19]
Janke et al.

[11] Patent Number: 5,450,328
[45] Date of Patent: Sep. 12, 1995

[54] SYSTEM FOR MEASURING LINE TO GROUND IMPEDANCE

[75] Inventors: Donald R. Janke, Milwaukee; James A. Rodrian, Grafton, both of Wis.

[73] Assignee: Square D Company, Palatine, Ill.

[21] Appl. No.: 215,347

[22] Filed: Mar. 21, 1994

[51] Int. Cl.⁶ .................... G01R 27/00; G01R 27/18
[52] U.S. Cl. .................... 364/482; 364/481; 364/483; 364/550; 324/509; 324/522; 324/527; 324/555; 340/635; 340/650; 361/42
[58] Field of Search ............ 364/550, 551.01, 556, 364/571.01, 571.02, 481, 482, 483; 324/509, 512, 522, 527, 555, 601; 73/1 R; 340/635, 650, 651; 361/42, 111, 107, 88

[56] References Cited
U.S. PATENT DOCUMENTS

| 3,969,711 | 7/1976 | Ahntholz | 340/255 |
| 3,971,007 | 7/1976 | Borkovitz et al. | 340/255 |
| 3,976,987 | 8/1976 | Anger | 340/255 |
| 3,978,465 | 8/1976 | Goode | 340/255 |
| 3,983,554 | 9/1976 | Goode | 340/413 |
| 4,200,933 | 4/1980 | Nickel et al. | 364/571 |
| 4,206,398 | 6/1980 | Janning | 324/51 |
| 4,321,643 | 3/1982 | Vernier | 361/48 |
| 4,472,676 | 9/1984 | Eichmann et al. | 324/51 |
| 4,528,497 | 7/1985 | Arato | 324/51 |
| 4,723,220 | 2/1988 | Smith-Vaniz | 364/492 |
| 4,896,115 | 1/1990 | LeMaitre et al. | 324/551 |
| 5,066,920 | 11/1991 | Supitz | 324/544 |
| 5,075,628 | 12/1991 | Schuster et al. | 324/510 |
| 5,101,160 | 3/1992 | Barjonnet et al. | 324/510 |
| 5,174,884 | 12/1992 | Shimada et al. | 204/406 |
| 5,272,440 | 12/1993 | Weynachter et al. | 324/522 |

OTHER PUBLICATIONS

Meliopoulos et al., "A PC Based Ground Impedance Measurement Instrument", Jul. 1993, IEEE Trans. on Power Delivery pp. 1095–1106.

Primary Examiner—Emanuel T. Voeltz
Assistant Examiner—Patrick J. Assouad
Attorney, Agent, or Firm—Michael J. Femal; Richard J. Graefe; Larry I. Golden

[57] ABSTRACT

A line isolation monitor (LIM) indicates the maximum hazard current of an ungrounded polyphase power distribution system. The LIM is microcontroller based and continuously monitors a fault impedance for the distribution system. The fault impedance is determined by the LIM by injecting a continuous sine wave measurement current into a ground terminal to generate a measurement voltage across the fault impedance. Using the measurement voltage and current, the LIM calculates the fault impedance and, using this impedance, calculates the hazard current based on the maximum line to ground voltage of the ungrounded system. The LIM has means for self-calibration and self-testing while on-line and during a power-up sequence to verify that components in the measurement circuitry are within specified tolerances.

22 Claims, 10 Drawing Sheets

SYSTEM FOR MEASURING LINE TO GROUND IMPEDANCE

DESCRIPTION

1. Technical Field

Applicants' invention relates generally to an apparatus for monitoring an ungrounded polyphase power distribution system and more particularly to a microprocessor based line isolation monitor (LIM) for detecting and indicating the magnitude of hazard leakage current in the distribution system and ground.

2. Related Applications

This application is related to the following, commonly assigned applications filed concurrently herewith, entitled "Monitor For An Ungrounded System" (Application Ser. No. 08/215,435, Our Docket OSH-1) and "System For Calibrating A Line Isolation Monitor" (Application Ser. No. 08/215,437, Our Docket OSH-2). The contents of these applications are expressly incorporated herein by reference.

3. Background Art

Standards set by the National Fire Protection Association (NFPA) as detailed in the National Electric Code, Article 517-104 require that each power circuit within an anesthetizing location, such as in a hospital operating room, shall be ungrounded and isolated from any distribution system supplying other, non-anesthetizing locations. Additionally, there is a requirement that a monitor must be used with the ungrounded system to provide a continuous indication of possible leakage or fault currents from any of the isolated conductors to ground. This requirement is for the safety of the patient. The normal high impedance of the human body can be bypassed during certain medical procedures such as when electrodes or probes are used to monitor heart activity, for instance. Under these conditions, alternating current flowing through the body could produce extreme shock or even death.

The ideal isolated conductor in an ungrounded system has infinite impedance to ground and no current flow would result if a short circuit or very low impedance was placed between the conductor and ground. In the real world, however, there are no perfect insulators. All isolated conductors experience some capacitive or resistive leakage current to ground. Insulation deteriorates with age and use. Capacitive leakage are inherently present in all systems. Both types of leakages increase by the number of devices connected to the system and the length of the conductors themselves. These leakages provide a current path to ground and if a grounded low impedance is connected to the isolated conductor, as might be the case with a heart monitor, the current has a return path due to the leakages. Total hazard current is defined as the total current that would flow through a low impedance conductor connected between ground and the isolated conductor. Total hazard current is a combination of fault hazard current, that current that results from all user devices, except for a LIM, connected to the isolated system, and monitor hazard current, that current that results only from a LIM connected to the isolated system. The NFPA standards require a visual and audible warning if the total hazard current exceeds a predetermined limit and also limits the amount of current attributed to the monitor.

Several types of LIMs have been available for some time. These include static ground detector and dynamic LIMs. These types, although somewhat effective, did not offer continuous monitoring, were somewhat difficult to use, and also added a large amount of hazard current to the total hazard current. One type of dynamic LIM that overcame some of these problems is disclosed in commonly assigned U.S. Pat. No. 3,976,987. A DC reference voltage, proportional to the maximum voltage to ground from either conductor of a two wire ungrounded system is determined and used as a reference voltage for the system. A capacitive component and a resistive component are generated from the reference voltage and are applied across the system leakage impedances in parallel. Circuitry within the LIM separates the impedance voltage response from the line voltage response to produce a difference signal. This signal is used to derive a combined resistive and capacitive component signal representing the maximum hazard current of the system. However, this type of monitor requires periodic manual calibration which requires removal from the system for calibration at a test bench. The monitor is frequency and voltage dependant, thereby requiring different versions to accommodate different voltages and line frequencies. Furthermore, the monitor and others similar to it have limited self-test capabilities. These self checks could determine if the monitor itself is operating properly. Some multiphase systems require more than one monitor on the same circuit. Prior art LIMs were not capable of being coupled to a circuit at the same time due to LIM to LIM interference. If the ground connection to the LIM itself is defective, measurement of the hazard current will be unreliable. It would be desirable to provide a line isolation monitor that overcomes these disadvantages and includes other features that accurately computes the hazard current of an ungrounded power system.

SUMMARY OF THE INVENTION

Accordingly, the principal object of the present invention is to provide an improved line isolation monitor for determining the hazard current of an ungrounded, polyphase system.

A further objective of the invention is to provide a line isolation monitor utilizing a method of self-calibration and self-testing of its internal circuitry.

An additional objective of the invention is to provide a line isolation monitor having a method of automatic detection of the line frequency of the ungrounded, polyphase system.

An additional objective of the invention is to provide a line isolation monitor having a method of monitoring the integrity of its ground connection.

Another objective of the invention is to provide a line isolation monitor having a means of communicating measured and calculated parameters with other peripheral devices.

Yet another objective of the invention is to provide a line isolation monitor having a means of measuring and compensating for the effects of stray capacitances within the line isolation monitor that could cause errors in the measurements.

In the preferred embodiment of the invention, a DLIM, which is a digital line isolation monitor, is microcontroller based and continuously measures the fault impedance of a polyphase, ungrounded or isolated system. The DLIM could be used to monitor the hazard current of an isolated power system as used in a hospital, or the leakage current of an isolated power system as used in a marina. The DLIM could also be used to detect the degradation of insulation of electrical motors coupled to isolated power systems. It injects a continuous sine wave measurement current into the ground terminal of the isolated system. This sine wave current signal is precise with respect to its frequency and phase angle from cycle to cycle. This current creates a test voltage across the hazard impedance. The microcontroller generates the precision phase sine wave signal that has a frequency that is a ratio of the line frequency of the isolated system, which is also determined by the microcontroller. The microcontroller uses the line frequency to calculate the actual capacitive reactance at the power line frequency. A frequency selective current to voltage converter locked to the test current frequency, measures the injected current. For each phase, a frequency selective amplifier with appropriate filtering, measures the voltage to ground potential, which is the sum of the test voltage and the actual line voltage to ground. The sum of the test voltages from each phase to ground is computed. Knowing the magnitude and the phase of the test current and the test voltages, the microcontroller calculates the hazard impedance using Ohms law $z(eq) = v/i$. The equivalent shunt resistance and capacitance are also calculated. Knowing the hazard impedance, the maximum hazard current to ground is determined by the relationship Ihmax = (Largest phase voltage)/Z(eq).

The microcontroller determines the largest phase voltage. The hazard current is displayed on a two digit display and an analog bar graph. When the total hazard current, which includes both resistive and capacitive leakage currents, reaches a predetermined alarm threshold, the DLIM produces visual and audible alarms. The microcontroller calculates the hazard current at least once every five seconds. Since the current and voltage measurements are frequency selective, by using two different test frequencies, two DLIMs can share the same ungrounded system without interference with each other.

For accurate results, the gains of the individual voltage amplifiers are measured and compared to theoretical values as determined from circuit design. This type of self calibration occurs every time the DLIM is powered-up, periodically during normal operation, or through a test mode which can be initiated manually. During this calibration check, the monitoring circuits of the DLIM are removed from the isolated system and known voltage and current signals are injected internally to the monitoring circuits to verify the component parameters. If the calibration parameters are outside tolerances by a predetermined amount, the DLIM annunciates a warning, but will continue to monitor the hazard current. If the deviation is greater than a second manual predetermined amount, the DLIM will indicate a fault and remove itself from service.

Other features and advantages of the invention, which are believed to be novel and nonobvious, will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1A:
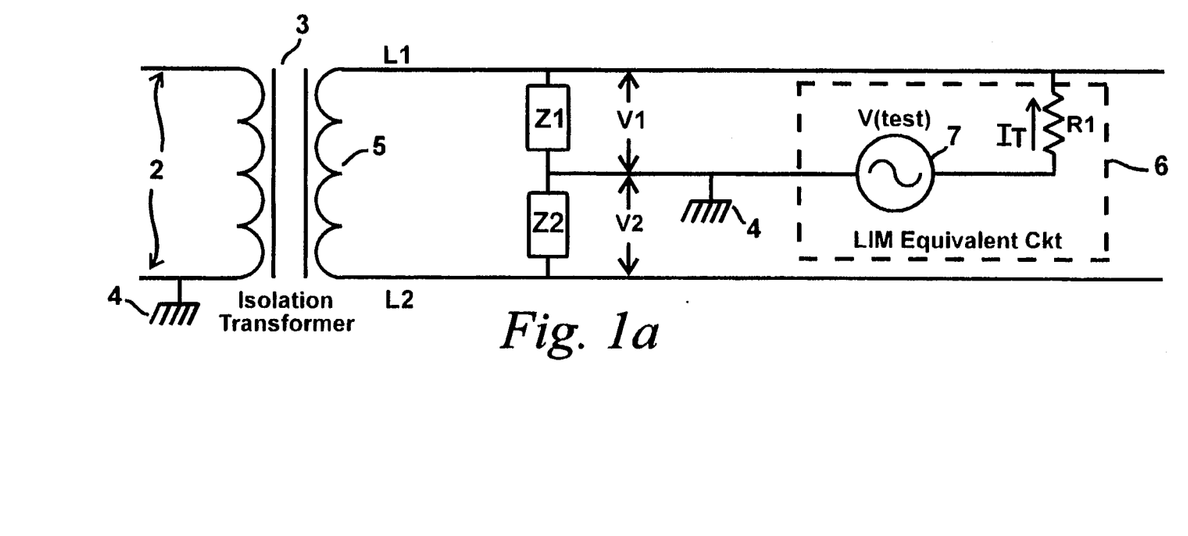
FIGS. 1a, 1b and 1c are effective circuit diagrams to illustrate the main principle of operation of a line isolation monitor connected to an isolated power system.
Figure 1B:
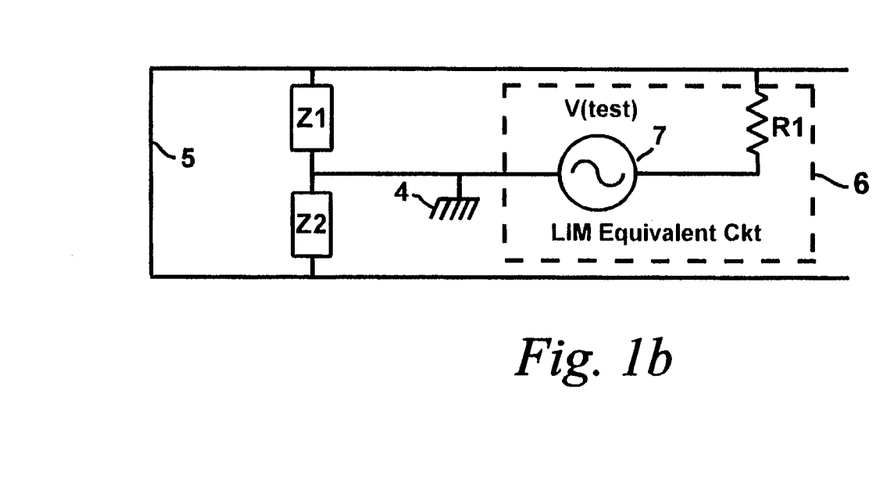
Figure 1C:
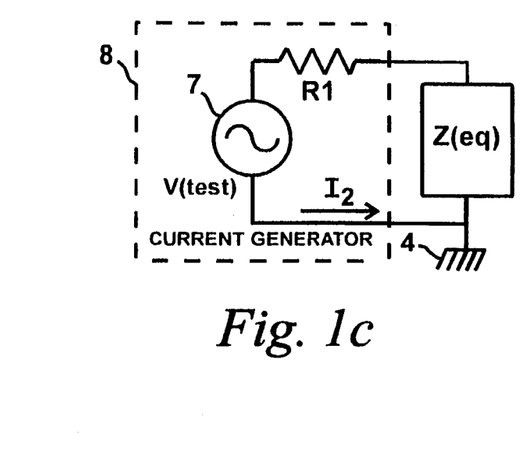

FIGS. 1a, 1b, and 1c illustrates a typical isolated power supply system having conductors L1 and L2. A grounded system 2 connected to earth ground 4 is connected to a primary winding of isolation transformer 3. L1 and L2 are coupled to a secondary winding 5 of transformer 3. Impedances Z1 and Z2 are called the hazard impedances and represent stray resistance and capacitance to earth ground 4. For a perfectly isolated system, Z1 and Z2 are infinity ohms and a grounded, low impedance object would experience no current flow if it came in contact with either L1 or L2 and ground. However, all isolated and ungrounded systems have some resistive and capacitive leakage to ground caused by the fact that there are no perfect insulators. Some current flow will therefore result if that grounded object contacts L1 or L2. The total current that could flow is defined as a hazard current. V1 and V2 are the line voltages measured to ground from L1 and L2, respectively, using conventional methods. To measure the equivalent impedance to ground, a test signal is injected into the isolated system by LIM 6. A test current $I_t$ is generated by the. LIM 6 and injected into the ground terminal 4. A voltage generator 7 produces voltage V(test) which has a predetermined amplitude and frequency. The current through R1, having a known resistance, becomes the test current $I_t$ and its value is easily calculated since V(test) and R1 are known. This current $I_t$ creates a test voltage across the impedances Z1 and Z2. The impedances Z1 and Z2 in turn, can then be calculated through Ohms law since the current $I_t$ is known and the test voltages across the hazard impedances can be measured.

Since the secondary winding 5 has a very low impedance to the test current $I_t$, it can be replaced by a short circuit as shown in FIG. 1b and rearranged in FIG. 1c whereby Z(eq) is the equivalent impedance of the parallel combination of Z1 and Z2. This shows that a Thevenin equivalent impedance can be measured using a current generator 8, represented by voltage generator 7 and resistor R1, from L1 or L2 to ground. The equivalent impedance Z(eq) is calculated by dividing the voltage across the current generator 8 by the generator current. Once Z(eq), the hazard impedance, is determined, maximum hazard current can be calculated using the greater line to ground voltage of either V1 or V2.

Figure 2:
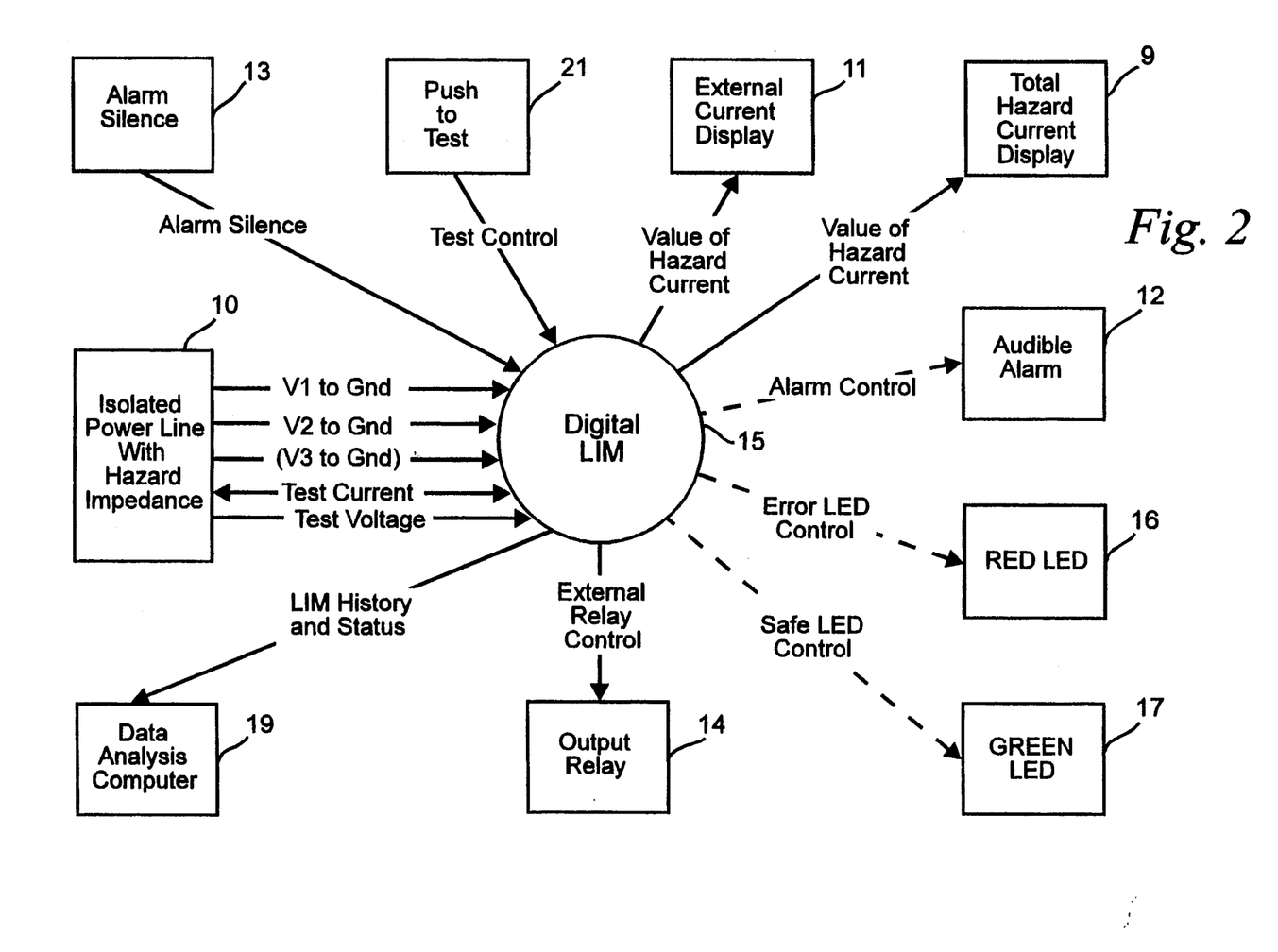
FIG. 2 is a context diagram of a line isolation monitor constructed according to the present invention.

FIG. 2 illustrates a functional or context diagram of a digital line isolation monitor (DLIM) 15 constructed according to the present invention. The voltage between the three phase conductors L1, L2, and L3 and ground of an isolated and ungrounded system 10 is measured by DLIM 15 by creating a test voltage that will inject a known test current into the line conductors L1-L3. Knowing these voltages and knowing the current, DLIM 15 calculates the hazard impedance. A maximum hazard current is then calculated by using the highest of the three line voltages. The hazard current will be displayed through a two digit display 9 which is part of DLIM 15 and a proportional analog signal to the hazard current will be sent to an external and remote current display 11. If the calculated hazard current current exceeds a selectable 2 mA or 5 mA threshold level, an audible alarm 12 will sound. Alarm silence switch 13 may disable the alarm after it has sounded. Output relay 14 will change state and visual red indicator 16 will turn-on indicating a hazard condition and visual green indicator 17 will turn-off to indicate that the ungrounded system 10 has a higher hazard current potential than the threshold level. DLIM 15 has a serial port for transmitting data to a computer 19 or other type of data processor. This data contains information of the status of DLIM 15 and data concerning the ungrounded system 10 that has been measured and calculated by DLIM 15. A test button 21 allows the DLIM to self test itself when depressed.

Figure 3:
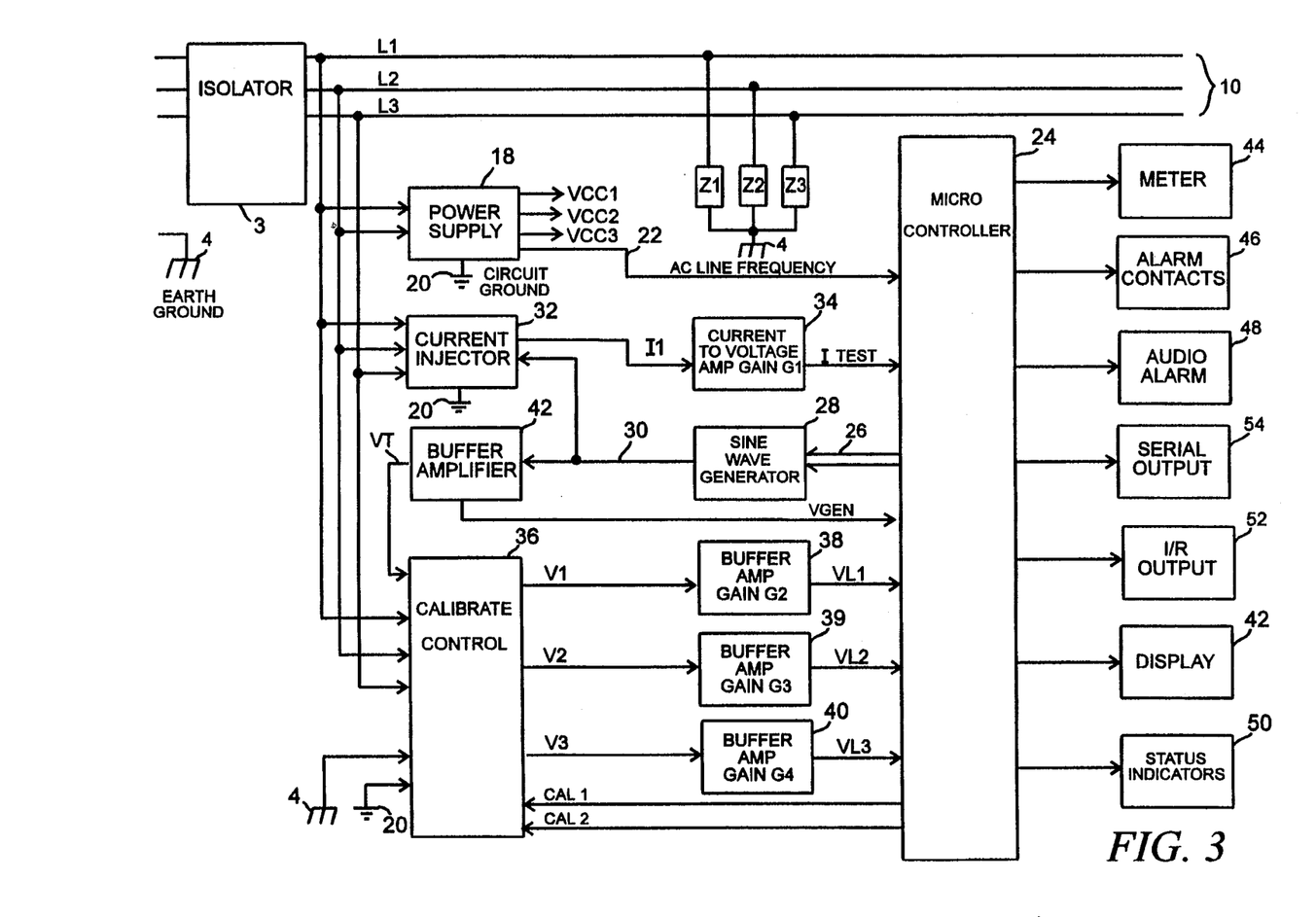
FIG. 3 is a schematic block diagram of a line isolation monitor constructed according to the present invention and as outlined in FIG. 2.

FIG. 3 is a schematic block diagram of the digital line isolation monitor (DLIM) 15 constructed according to the present invention and as outlined in FIG. 2. The three phase isolated and ungrounded system 10 has conductors L1, L2, and L3 is isolated from a grounded system by some isolation means 3. The ungrounded system could be of any type such as from a generator, an inverter system from a UPS system, or an isolation transformer. Hazard impedance in each leg is designated by Z1, Z2, and Z3, respectively. A power supply 18 connected to L1 and L2 generates the circuit supply voltages and circuit ground 20. Signal 22 is used by a microcontroller 24 to determine the line frequency of the ungrounded system. The microcontroller 24 contains at least a CPU, a memory, and analog to digital (A/D) converters. All signal processing, calculations, control signals, and outputs are controlled by the microcontroller 24. The microcontroller 24 generates digital signals 26 that go to a sine wave generator 28 to produce a sine wave signal 30. These signals 26 are generated 16 times per cycle at a predetermined frequency which is related to a ratio of the line frequency signal 22. A hardware low pass filter smooths the output 30 to make it continuous between sample points.

Current injector 32 is driven by sine wave signal 30 to create a test current I1 which is injected into L1, L2 and L3 and is used to determine the hazard impedance as previously discussed. A current to voltage converter 34 measures the injected current and sends a signal ITEST to the microcontroller 24.

A calibration control 36 provides switching functions between monitoring the line voltages V1–V3 and a calibration voltage Vt during calibration and also provides the means for injecting the test current I1 into earth ground 4. Control signals CAL1 and CAL2 are generated by microcontroller 24 during the calibration procedure or test mode. In normal operation when the DLIM 15 is monitoring and measuring the hazard current, line voltages V1–V3 are coupled to buffer amplifiers 38–39 having gains of G2, G3, and G4, respectively.

Buffer amplifier 38 measures the L1 voltage to ground V1 which is the sum of the L1 voltage to ground and the test voltage created from the injected test current I1. Output VL1 is equal to V1*G2. Using the relationship that V1=(IV*G2)/G2, the microcontroller 24 calculates the actual V1 voltage to ground. The gain G2 is measured, and as will be discussed later, is checked during calibration to ensure that it has not changed and is within predetermined tolerances. In a similar manner, voltages V2 and V3 to ground are calculated and gains G3 and G4 are measured by the microcontroller 24. The microcontroller 24 will add the VL1 and VL2 signals. Each of these signals is the algebraic sum of the line voltage to ground, which is at line frequency, and the test voltage signal, which is at a ratio of the line frequency. Since the test voltage component to ground has the same phase and amplitude relationship for VL1 and VL2, the sum will be double the amplitude of the test voltage. The line frequency signals L1 and L2 to ground are 180 degrees out of phase, and will be cancelled when summed together if the impedances Z1 and Z2 are equal. If unequal, L1 and L2 will not cancel, but the test voltage is still doubled, increasing the ratio of the test voltage to the line voltage over the case of measuring the test signal to ground on a single line. A frequency selective voltmeter function within the microcontroller 24 locked to the frequency and phase of the test current measures the sum of the test voltages from L1 and L2 to ground. Likewise, a frequency selective ammeter function also locked to the frequency and phase of the test current measures the current injected into the system. With these quantities calculated, the microcontroller 24 then calculates a complex hazard impedance using Ohms law z(eq)=v/i. The equivalent shunt resistance and capacitance are also calculated. Since these quantities are complex numbers, both magnitude and phase are calculated. Additionally, the calculated hazard impedance must be corrected to represent the impedance at line frequency since the test current is not at the same frequency as the line frequency. The impedance is modeled as a resistor-capacitor parallel combination. Although the real part is not frequency dependent, the imaginary part is frequency sensitive. To correct for this difference, the imaginary part of the impedance, expressed as an admittance, is multiplied by the ratio of the line frequency to the test frequency to give the admittance at the line frequency.

In order for the microcontroller 24 to calculate the amplitude and phase of the complex phase voltages VL1–VL3, a discrete Fourier transform (DFT) process is used. Since the injected test current I1 is generated by the microcontroller 24, the measured voltages are phase coherent with the measurement signals. The DFT acts as a frequency selective voltmeter, phase locked to the frequency of the test signal, and separates the real and imaginary parts of the measured signals using the following equations:

$$\text{REAL PART} = K \sum_{0}^{n} Vn \, \text{SIN}(\theta) \qquad \text{eq. 1}$$

and $$\text{IMAGINARY PART} = K \sum_{0}^{n} V_n \cos(\theta) \qquad \text{eq. 2}$$

As is obvious to one skilled in the art, other Fourier Transforms such as a Fast Fourier Transform (FFT) could be used in place of the DFT function. The sums are calculated over multiple cycles of the test frequency. Vn is the value of the input voltage being measured, VL1, VL2, or VI3, at position $\theta$ in the cycle. These sums are scaled to represent the real and imaginary parts of the input voltage. Values for the sine and cosine functions are taken from lookup tables programmed into the microcontroller 24. To reduce errors caused by spectral leakage, the input voltages are first windowed using a modified Kaiser-Bessel window. This modification involves the use of discrete points in the window function to represent the window function at a given position. This allows for a decrease in the size of the window function.

Knowing the hazard impedance, the maximum hazard current to ground is determined by microcontroller 24 using the relationship Ihmax=(Largest phase voltage)/Z(eq). The microcontroller 24 measures the phase voltages V1-V3 and determines the largest of the phase voltages V1-V3 using a DFT tuned to the line frequency.

The hazard current is displayed on a display panel 42 having a two digit display for displaying the hazard current in milliamperes (mA), a single digit for displaying a threshold current, and an analog bar graph for displaying a percentage, from 0 to 160 percent, of the threshold current. The threshold current can be set for either 2 mA or 5 mA and is the point whereby the DLIM will indicate a safe condition if the measured hazard current is below the threshold and a hazard condition if the hazard current is above the threshold. An analog signal is also created by the microcontroller 24 to drive a remote analog meter 44 for also displaying the hazard current. When the total hazard current, which includes both resistive and capacitive leakage currents, reaches the predetermined alarm threshold, alarm contacts 46, audible alarm 48, and visual status indicator 50 are energized from signals generated by microcontroller 24. The microcontroller 24 calculates the hazard current at least once every five seconds. Since the current and voltage measurements are frequency dependant, microcontroller 24 has provisions for changing the frequency of the sine wave generator 28 and thus the frequency of the injected test current. Since the DFT voltmeters are very frequency selective, this will allow different DLIMs, operating at different test current frequencies, to share the same ungrounded system without interference from each other.

Microcontroller 24 also has provisions for broadcasting data through an infrared port 52 and a serial communications port 54. This data includes measured and calculated values relating to voltage, current, impedance, and frequency, among other operating conditions. The infrared port allows for ground isolation between the system and the remote location receiving the infrared signals. The serial data is in ASCII format using the Hewlett Packard HP-95LX serial infrared protocol, although other protocols are possible.

Figure 4A:
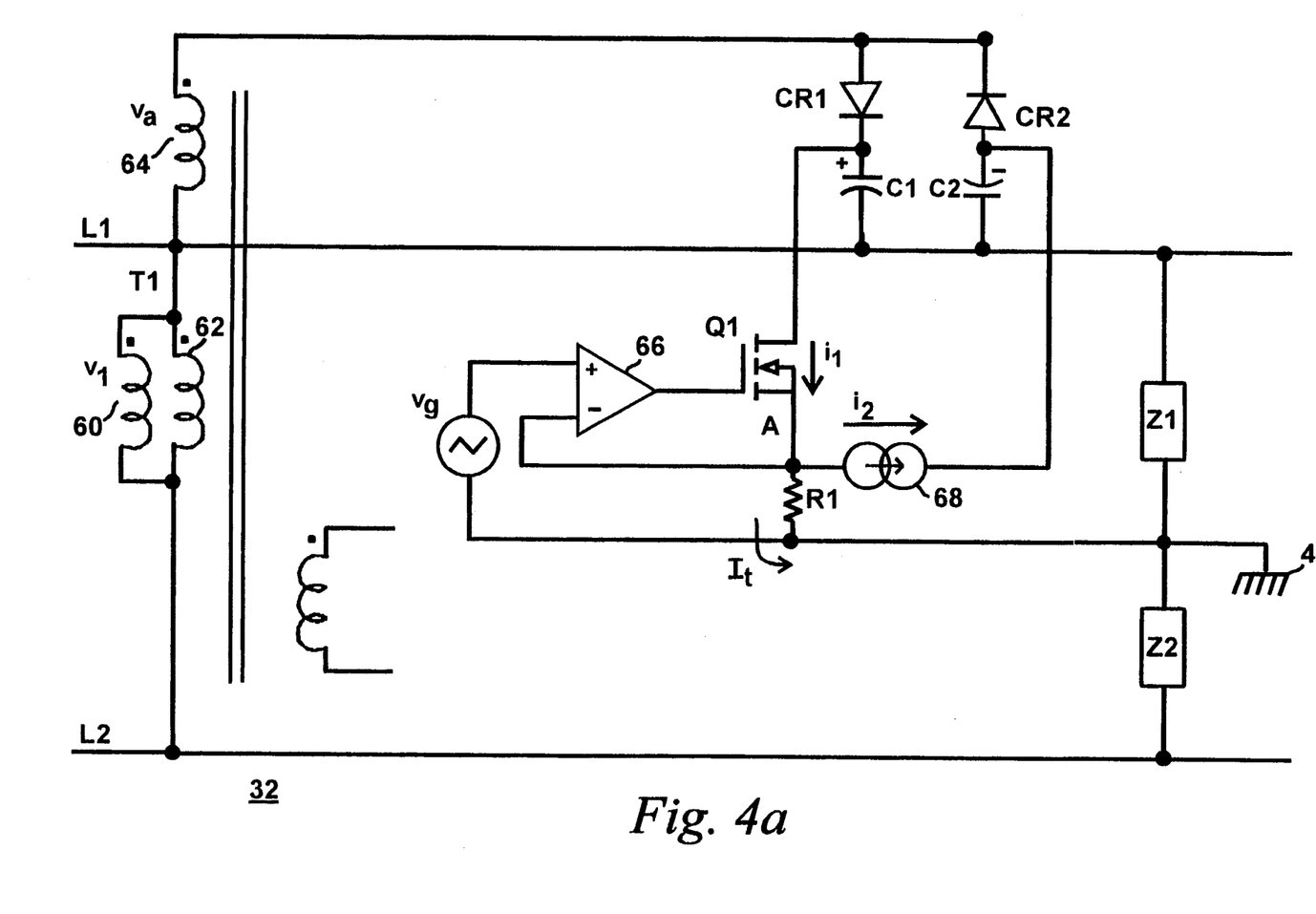
FIGS. 4a and b are detailed schematic block diagrams of a current generator and injector as depicted in FIG. 3 configured for 120 volt or 240 volt operation, respectively.

FIG. 4a details operation of the test current injector 32 configured for 120 volt operation. Transformer T1 has windings 60 and 62 connected in parallel across the L1, L2 power line voltages. Capacitor C1 will be charged to the positive peaks of V1+Va by the power line through an auto transformer winding 64 of T1 and diode CR1. Similarly, capacitor C2 will be charged to the negative peaks of V1+Va through winding 64 of T1 and diode CR2. Node A is a current summing node and, under Kirchhoff's current law, the currents entering and leaving node A must sum to zero. The input currents into operational amplifier 66 are very small and can be considered to be essentially zero. Op amp 66, along with Q1 and R1 form a voltage to current converter and will vary current i1 so that the voltage across R1 will be the same as vg. Any variation in the feedback voltage across resistor R1 will cause op amp 66 to change its output voltage, changing the conductivity of transistor Q1 and modulating the test current $I_t$. Q1 is a MOSFET having negligible gate current. Previous current generators used bipolar transistors which have measurable base current that added to the test current, giving erroneous results when measuring the resultant test voltage. Current generator 68 produces a constant current i2. The test current $I_t$ will varying according to the relationship between i1 and i2. If i1 equals i2, the test current $I_t$ will be zero. If i1 is greater than i2, the test current $I_t$ will flow out of node A, through R1 to earth ground 4 and the hazard impedances Z1 and Z2, and return to the negative terminal of capacitor C1. If i1 is less than i2, the test current $I_t$ will flow from the positive terminal of capacitor C2, through the hazard impedances Z1 and Z2, through R1, and into node A. The current $I_t$ flowing through R1 is equal to vg/R1, using Ohms law. Voltage vg is the sine wave signal 30 generated by the microcontroller 24 and sine wave generator 28 and current $I_t$ becomes the test current I1 flowing through the equivalent hazard impedance Z(eq) previously discussed. Transformer T1 is an autotransformer and is used to boost the line voltage since the test current $I_t$ must flow during peaks of the line voltage which buck the the test voltage. The voltage va sets the compliance of the current source during peaks of the power line.

Figure 4B:
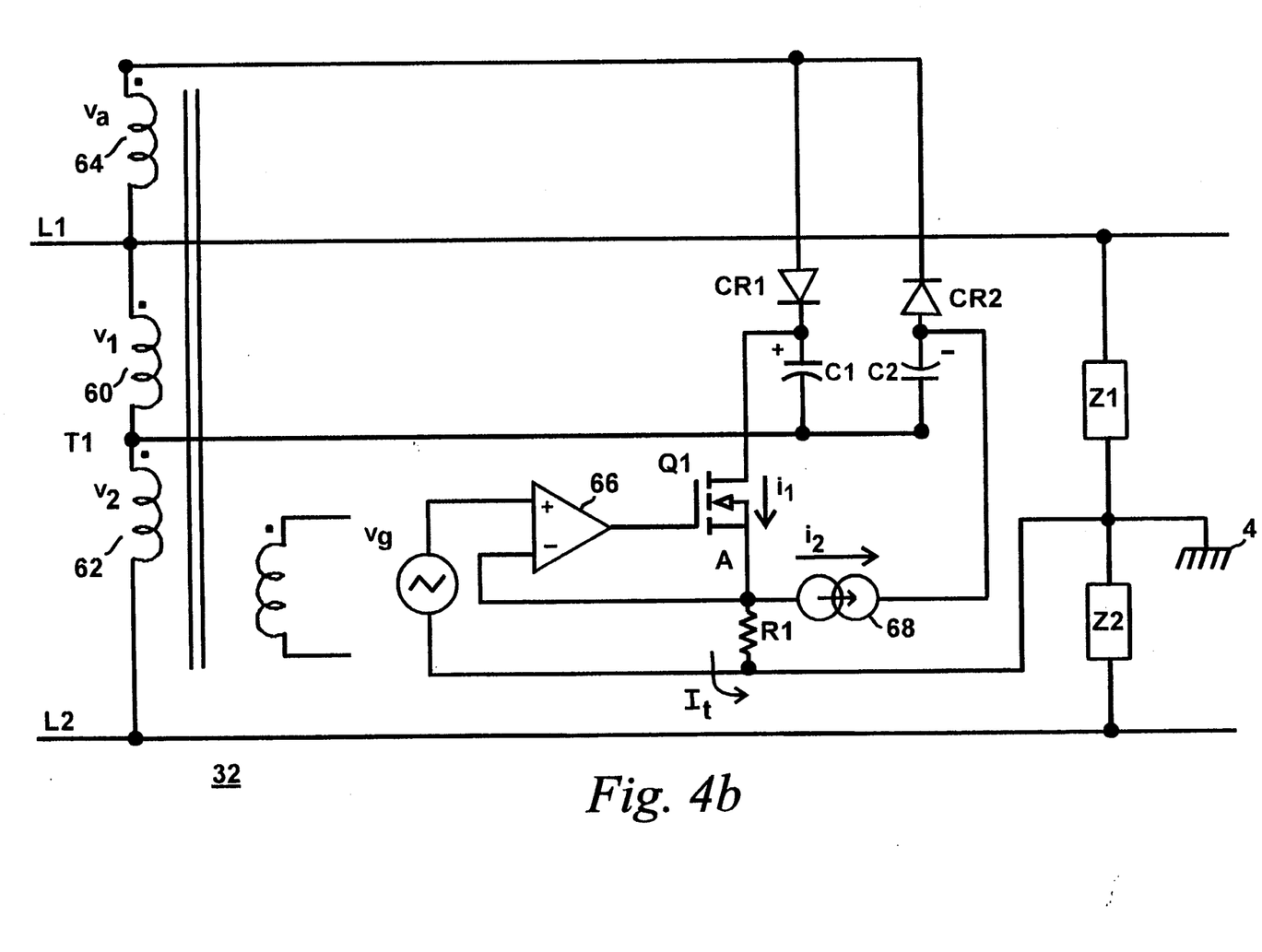

To provide versatility with the DLIM, the same current injector circuit 32 can be used on a 220 volt system without changing component values. Through the use of a voltage selector switch, the configuration of transformer T1 can be changed so that the primary windings 60 and 62 are connected as shown in FIG. 4b. This switch also moves the junction of C1 and C2 from L1 to the center tap of T1. This modifies the current paths for the test current $I_t$ such that if i1 is greater than i2, the test current $I_t$ will flow out of node A, through R1 to earth ground 4 and the hazard impedances Z1 and Z2, through the primary winding 60, and return to the negative terminal of capacitor C1. If i1 is less than i2, the test current $I_t$ will flow from the positive terminal of capacitor C2, through the primary winding 60, through the hazard impedances Z1 and Z2, through R1, and into node A. The remainder of the circuit functions the same as the 120 volt version.

Figure 5A:
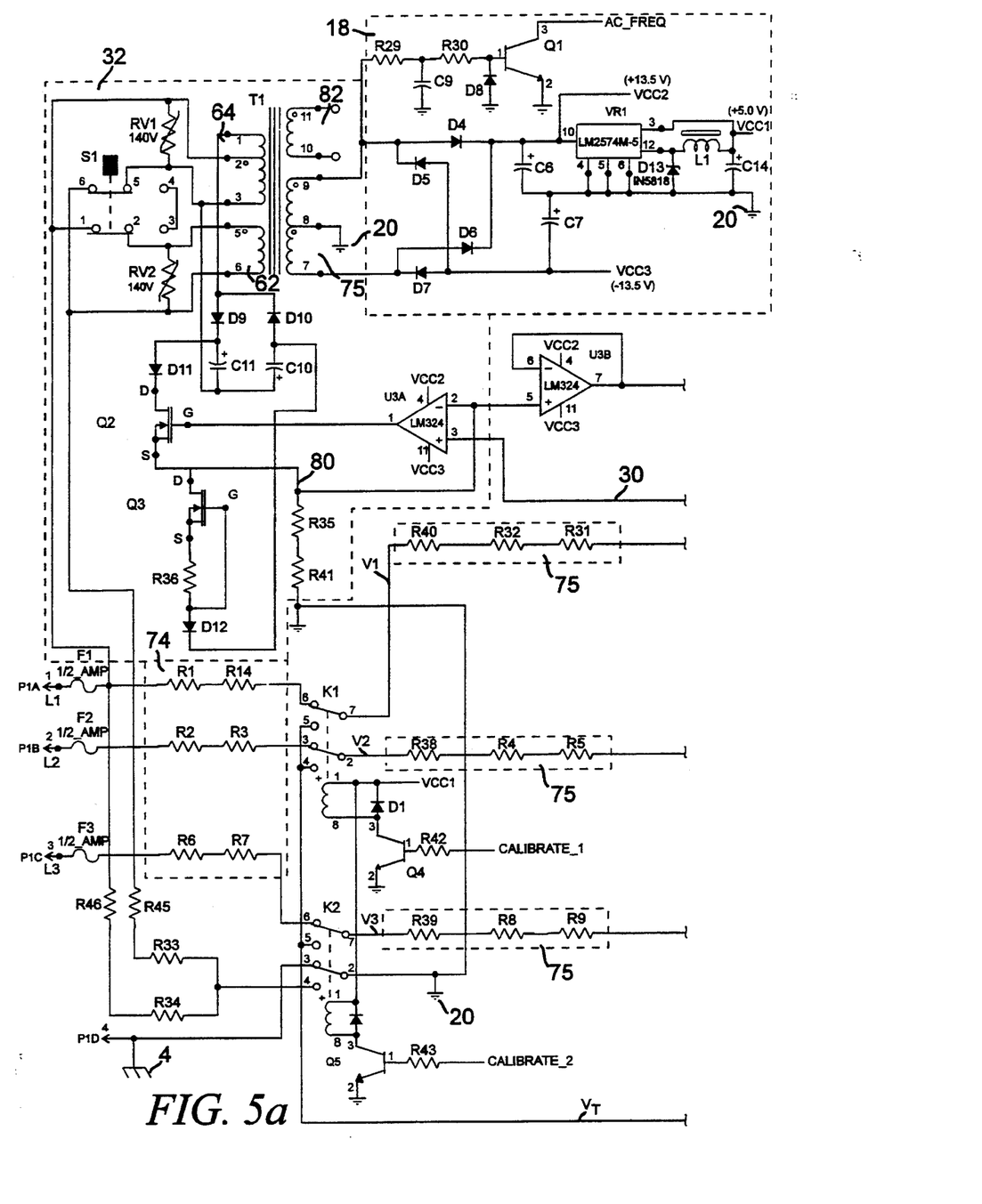
FIGS. 5a, 5a' and 5b, 5b' are detailed schematic diagrams of the line isolation monitor constructed according to the present invention and as depicted in FIG. 3.
Figure 5B:
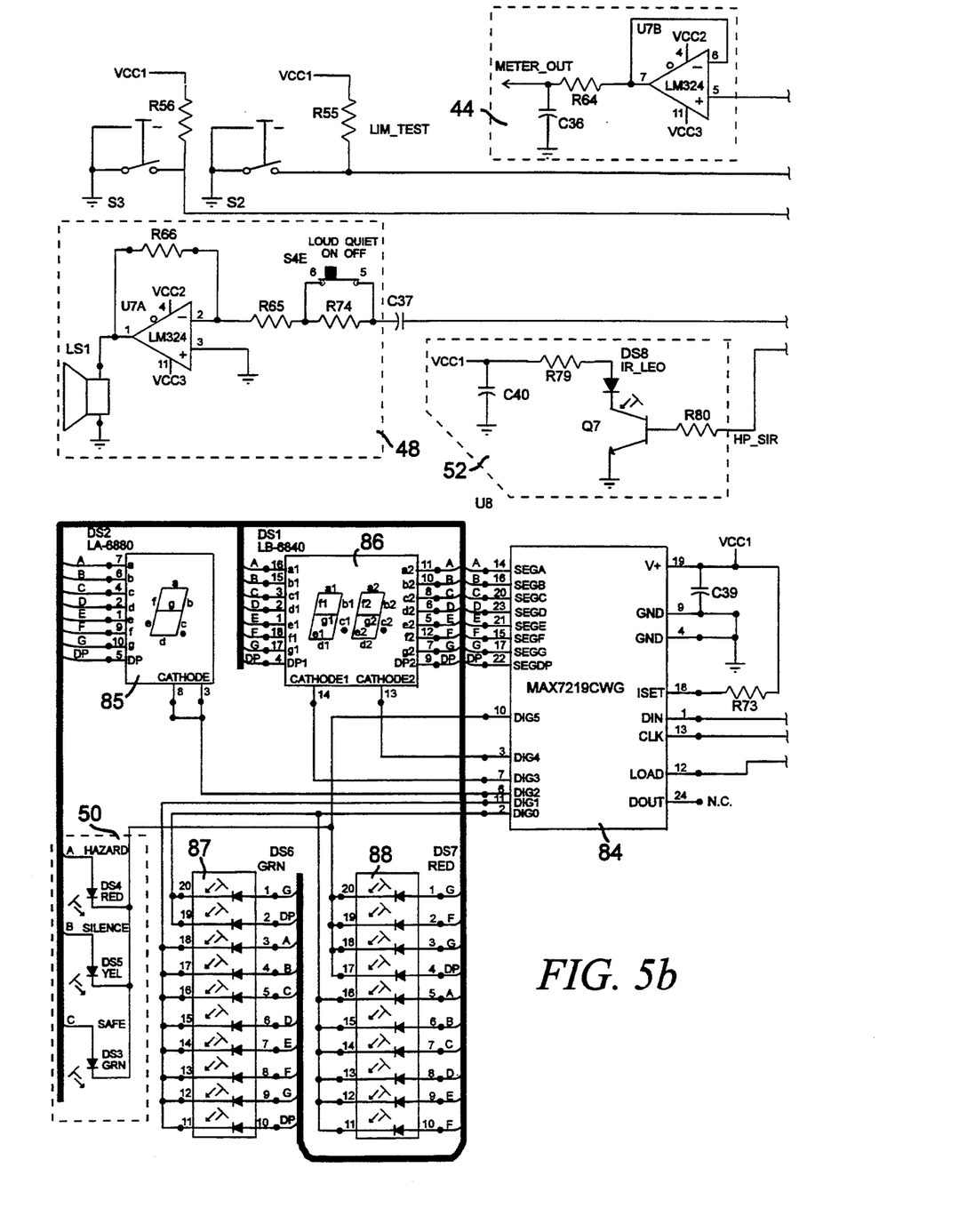

FIGS. 5a and 5b are detailed schematic diagrams of the preferred embodiment of the digital line isolation monitor 15 of the present invention and as detailed in FIG. 3. Values for standard resistors, capacitors, and biasing networks obvious to one of ordinary skill in the art have not been detailed. Microcontroller 24 comprises a 16 bit Motorola MC68HC16Z1 microcontroller chip 70 with on-chip A/D converters and support circuitry including a reset circuit 71, an EPROM memory 72, and system clock 73. Microcontroller 24 has an internal watchdog timer which is updated periodically. If it ever times out, due possibly to a transient that may have corrupted its internal or external memory, the microcontroller 70 will reset itself and start a new power-up sequence. An internal counter will keep track of the number of timeouts. This will also occur if the microcontroller 70 detects spurious interrupts which also could have been due to transients.

For a three phase system, incoming line conductors L1–L3 are connected to terminals 1–3, respectively. For a single phase system, the L3 terminal 3 is left open. Switch S4D is used to select the single or three phase mode of operation. Because the DLIM 15 may be connected to branch circuits without circuit breakers or other protective devices, fuses F1–F2 provide internal fusing of the L1–L2 lines. All input resistors 74 are carbon film and flame proof to absorb the line voltages in the event of contact failure of switching relays K1 and K2. Relays K1 and K2 function as part of the calibration control 36. With the relays deenergized, as shown, the voltages are coupled through resistors 75 for scaling by buffer amplifiers 38–40. Resistors 75 present very high impedance to maintain at least 30 megohms of resistive impedance to ground, limiting the DLIM hazard current. The outputs VL1–3 of amplifiers 38–40 are proportional to the line voltages V1–V3 measured with respect to ground and are inputted to microcontroller 70 for processing.

The complex gain of each amplifier 38–40 is measured and checked during calibration to ensure that it has not changed and is within predetermined tolerances calculated from theoretical values of the system components. Relays K1 and K2 route the calibration voltage Vt to the inputs of amplifiers 38–40. The complex gains of the amplifiers are calculated using the ratio of the output voltages VL1–3 to the input voltage Vt. Since the gain is the ratio of two signals derived from Vt, the exact value of the gain can be found without knowing the exact value of Vt. After calibration, microcontroller 70 compares the measured calibration parameters to the theoretical values as determined from the circuit design. If the comparison shows that these parameters are outside the tolerances by a first predetermined amount, DLIM 15 will annunciate a warning but will still continue to monitor the hazard current. If these parameters are outside the tolerances by a second and greater predetermined amount, DLIM 15 will declare a fault and remove itself from service and annunciate a warning. DLIM 15 calibrates itself at a rate that will allow relays K1 and K2 to have at least a ten year life. In a background calibration mode, a single calibration of the individual parameters such as gain G2 is made periodically and separately at one minute intervals to meet a hazard current response time requirement that calls for continuous monitoring of the hazard current. Over time, this will allow for all appropriate parameters to have been recalibrated. As discussed above, the gain of amplifiers 38–40 will be calculated at the test frequency and will have to be compensated to generate the gain at the line frequency of the system.

In addition to the gain checks during calibration, proper operation of the DLIM 15 is periodically monitored by a self check. When relay K2 is energized by control signal CALIBRATE 2 from microcontroller 70, The DLIM's signal ground is switched from earth ground 4 to the midpoint of series connected precision resistors R33, R34, R45, and R46. These resistors have the same impedance and are connected across L1 and L2. Under this condition, the hazard impedance becomes the parallel combination of R34-R46 and R33-R45. The DLIM 15 measures this impedance at the test frequency, using the same method as it uses to calculate the hazard impedance during normal operation, and compares the impedance with a theoretical equivalent resistance based on the values of the resistors. If the measured value is within tolerance, the DLIM 15 will be assumed to be operating correctly. If not, the DLIM 15 will enter an error state which will be described later. A failed test could result from a faulty current injector 32 or current to voltage converter 34, defective relays K1 or K2, or a faulty A/D converter channel, including amplifiers 38–40. This test also checks the ratio of L1 to ground and L2 to ground at the line frequency. Since the resistors are equal, this ratio should very nearly equal 1. If the ratio is outside by a predetermined tolerance, the DLIM will also enter the error state. DLIM 15 also checks the external ground connection 4 which must be connected for proper operation of the DLIM 15. The missing ground detector relies on the fact that there is always some impedance to ground in any practical installation. If the DLIM 15 detects that the hazard impedance is greater than the largest practical impedance, which is approximately 8 megohms, the DLIM will consider it a fault, sound an alarm, and display an error code on a digital display.

Transformer T1 has primary windings 60, 62 connected to L1 and L2 with switch S1 providing a means of connecting them in parallel or in series to accommodate line voltages of either 120 V or 240 V. Winding 64, as previously discussed, along with windings 60 and 62 are used with the test current injector circuit 32 to inject the test current $I_t$ into line conductors L1 and L2. Transient and surge voltage protection is provided by suppressors RV1 and RV2. Center tapped secondary winding 75 provides the voltage source for power supply 18, which generates the circuit voltages for the DLIM 15. A conventional switching regulator circuit, the details of which are well known, and are not an object of the present invention, is utilized to generate the circuit voltages for the DLIM 15. Transistor Q1, with appropriate biasing and filtering, outputs signal ACFREQ for inputting to microcontroller 70 for determining the line frequency of the isolated system.

DLIM 15 sets the test frequency as a multiple of the power line frequency. Microcontroller 70 measures the line frequency by measuring its period, using the microcontroller clock, as determined by crystal 73, as a time base. This clock is not exact and will vary with time and temperature. However, this clock is also used to set the sample times for the test current $I_t$ and sampling the test voltages, and absolute timing accuracy is not required. The sample time is given as:

SAMPLE TIME = 1/(128*TEST FREQUENCY)     eq. 3

DLIM 15 samples the test voltages 128 times per cycle and samples the power line signal n times per power line cycle. The line frequency can then be expressed by the equation:

LINE FREQUENCY = 1/($n$*SAMPLE TIME)     eq. 4

Substituting eq. 3 into eq. 4 gives:

$$\text{LINE FREQUENCY} = (128/n) * \text{TEST FREQUENCY} \qquad \text{eq. 5}$$

The test frequency is therefore given by:

$$\text{TEST FREQUENCY} = (n/128) * \text{LINE FREQUENCY} \qquad \text{eq. 6}$$

The term n is a design variable and is used to select the approximate test frequency for a given line frequency and provides a method of selecting different test frequencies.

Any wave form can be built from a weighted sum of square waves. Microcontroller 24 generates a sine wave using this principle with a Walsh sine wave generator. Walsh functions are described in an article entitled "Walsh Functions" in the September, 1977 issue of *BYTE MAGAZINE* and are not a direct object of the present disclosure. The sine wave is generated by a circuit that consists of a digital expander which expands an input square wave into a variety of digital waveforms and an analog adder that will recombine, in a predetermined ratio, the digital waveforms to produce an analog output having a frequency related to the original square wave. The digital waveforms are square waves and are subsets of the original input square wave. As an example, the first waveform SAL(0) may be a square wave having a period x. Function SAL(1) may have a period of x/2 and SAL(2) may have a period of x/4, and so on. Each of the functions SAL(n) will be added to a composite waveform according to a Gray code. If the period is divided into n segments, the first Walsh function WAL(0) could consist of SAL(1), the second would consist of SAL(1) and SAL(2), the third would include only SAL(2), and so on. Different waveforms can be generated if the analog adder adds only some of the resultant Walsh functions. For the present invention, a sine wave is generated using three Walsh terms: SAL(1), SAL(3), and SAL(7). They are summed together by a summer circuit 28 consisting of operational amplifier U7C with input resistors 78 according to the equation:

$$\text{SINE WAVE} = 1.0 * \text{SAL}(1) + 0.5 * \text{SAL}(3) + 0.25 * \text{SAL}(7) \qquad \text{eq. 7}$$

The amplitude of the sine wave can be reduced simply by dividing both sides of equation 7 by a constant. Thus, to reduce the sine wave amplitude by one half, the new equation becomes:

$$\text{SINE WAVE}/2 = 0.5 * \text{SAL}(1) + 0.25 * \text{SAL}(3) + 0.125 * \text{SAL}(7) \qquad \text{eq. 8}$$

This ability to change the magnitude of the sine wave output of sine wave generator 28 provides a means to increase or decrease the test voltage VT, allowing for better resolution of the hazard current calculations at the lower current levels. The microcontroller 70 will set the amplitude of the sine wave output based on the hazard impedance of the distribution system to maintain a compliance of the amplitude of the test current $I_t$. The input resistors 78 have resistance values that are correspondingly divided by two. Only three of the input resistors 78 are used at one time such that the amplitude of the sine wave, and ultimately the amplitude of the test voltage VT and test current $I_t$ can be easily changed by shifting the three Walsh terms to different consecutive summing resistors 78. Amplifier U1A also acts as a hardware low pass filter which smooths the output 30 to make it continuous between the sample points. The resultant voltage output signal F is coupled to amplifier U1A for filtering the resultant odd harmonics. The theoretical coefficients are not exactly 0.5, 0.25 and 0.125, which will add some distortion to the waveform of signal F. Output 30 of amplifier U1A is coupled to the current injector circuit 32 and is also used to produce the test voltage Vt used in calibration and self-testing.

Operation of the current injector circuit 32 has been previously discussed with reference to FIGS. 3a and 3b. Double-pole, double-throw switch S1 configures transformer T1 for 120 volt or 240 volt operation. With S1 as shown, windings 60 and 62 are connected in parallel across the L1, L2 power line voltages. Capacitor C11 is charged to the positive peaks of V1+Va by the power line through an auto transformer winding 64 of T1 and diode D9. Similarly, capacitor C10 is charged to the negative peaks of V1+Va through winding 64 of T1 and diode D10. Node 80 is the current summing node A and currents entering and leaving it must sum to zero. Signal 30 from amplifier U1A as inputted to pin 3 of op amp U3A for modulating the test current $I_t$ flowing into the ground node 4. Op amp U3A, along with Q2 and the resistor combination of R35 and R41 form a voltage to current converter and will produce a current I1 into node 80 such that the current through the R35 and R41 will create a voltage across R35 and R41 that will be the same as signal 30. The current through R35 and R41 becomes the test current $I_t$. Transistor Q3, which is an N-channel depletion mode MOSFET combined with resistor R36 in its source lead is a current generator for producing a constant current i2 into node 80. Test current $I_t$ varies according to the relationship between i1 and i2 as previously discussed. With switch S1 in its other state, windings 60 and 62 are connected in series, allowing the same current injector circuit 32 to be used on a 240 volt system without changing component values. Switch S1 also moves the junction of C10 and C11 from L1 to the center tap of T1. This modifies the current paths for the test current $I_t$ such that if i1 is greater than i2, the test current $I_t$ will flow out of node 80, through R35 and R41 to earth ground 4 and the hazard impedances Z1 and Z2, through the primary winding 60, and return to the negative terminal of capacitor C11. If i1 is less than i2, the test current $I_t$ will flow from the positive terminal of capacitor C10, through the primary winding 60, through the hazard impedances Z1 and Z2, through R35 and R41, and into node 80. The remainder of the circuit functions the same as the 120 volt version. Amplifiers U3B and U2C scale the voltage across resistors R35 and R41 to create signal ITEST for use by the microcontroller 70 in calculating the hazard impedance and other parameters. A −2.5 VDC voltage level provides a means of level shifting of the test current signal ITEST and the voltage signals V1–V3 since these voltages are AC signals and must be positive voltages for inputting to the microcontroller 70.

Microcontroller 70 receives various inputs from program switches to control the configuration of DLIM 15. Switch S4A determines if the hazard alarm threshold will be 2 mA or 5 mA. Switch S4B determines the frequency of the voltage test signal VT from the DLIM 15, allowing two different DLIMs to monitor the same system without interference from each other. Switch S4C disables the audio alarm 48. When this is in the OFF position, the audio alarm will be disabled. The alarm will sound however for calibration warnings, DLIM faults, and missing ground faults.

DLIM 15 has various indicators to provide a visual indication of its status in addition to the SILENCE LED DS5. A green SAFE LED DS3 is used to indicate that the hazard current is below the threshold level selected, either 2 mA or 5 mA. A red HAZARD LED DS4 when lit, indicates that the hazard current is above the threshold level, or indicates that an error condition exists for the DLIM itself. This error condition does not imply that the power system is unsafe, but is meant to alert the user that its safety is unknown since the DLIM may not be monitoring the power line accurately. Multiplexer and driver circuit 84 receives data from microcontroller 70 and directs it to a single digit display 85 for displaying the selected threshold current, a two digit display 86 for displaying the hazard current, and a 20 segment analog bar graph display 87, 88 for indicating, in ten percent increment, the percentage of threshold current that the hazard current is at. The first ten segments are from 0 to 100 percent and may be green to indicate that the hazard current is below the threshold level. Segments 11-16 are red and indicate up to 160 percent.

In addition to controlling a bar graph display, the microcontroller 70 has other outputs for conveying the status of the DLIM and the power system it is monitoring. This includes a pulse width modulated output METER OUT that is proportional to the hazard current. This provides a method for driving an analog meter 44 that would be at a location remote from the DLIM. A serial communications channel 54 is coupled to amplifier U7D for one way communication with a peripheral device to communicate measured and calculated parameters and other pertinent data. An infrared port 52 will also output this information approximately every two seconds. This information will be in ASCII format using a Hewlett Packard HP-95LX serial protocol and will include line to ground RMS voltages, shunt impedance, test current and voltages, hazard current, number of watchdog time-outs or spurious interrupts, and the cause of last microcontroller reset. Besides the audio alarm output 48, the microcontroller 70 will energize a two pole, form C contact relay K3 when the threshold level has been exceeded. One set of contacts of K3 is uncommitted, allowing the user to control a variety of different devices. The other set of contacts supplies an isolated low voltage from an isolated secondary from transformer T1 that can be used to control a remote annunciator such as Square D Company's models IA-1C and M5-IA1.

Microcontroller 70 performs all diagnostics and self tests at preset times. At initial energization or power-up it will test the microcontroller hardware and software, sequentially test the analog and digital displays for a visual test, test the ground connection, measure the power line frequency, and calibrate and test the measuring circuitry. The DLIM 15 will enter an error state if any of the tests fail. In this state, the two digit display will display an "Er" message, activate the audio alarm, turn off the SAFE LED and turn on the HAZARD LED. Activating test button S2 will place a two digit error code in the two digit display. This error code will indicate the reason for the failure as indicated in Table 1 as follows:

TABLE 1

| ERROR CODE | ERROR CONDITION |
| --- | --- |
| 01 | Test voltage gain is high |
| 02 | Test voltage gain is low |
| 10 | L1 gain is high |
| 11 | L1 gain is low |
| 20 | L2 gain is high |
| 21 | L2 gain is low |
| 40 | Low test generator current |
| 41 | High test generator current |
| 50 | No ground connection |
| 60 | Test generator voltage is low |
| 61 | Test generator voltage is high |

Releasing the test button S2 will reset the DLIM and restart the power-up sequence.

Figure 6:
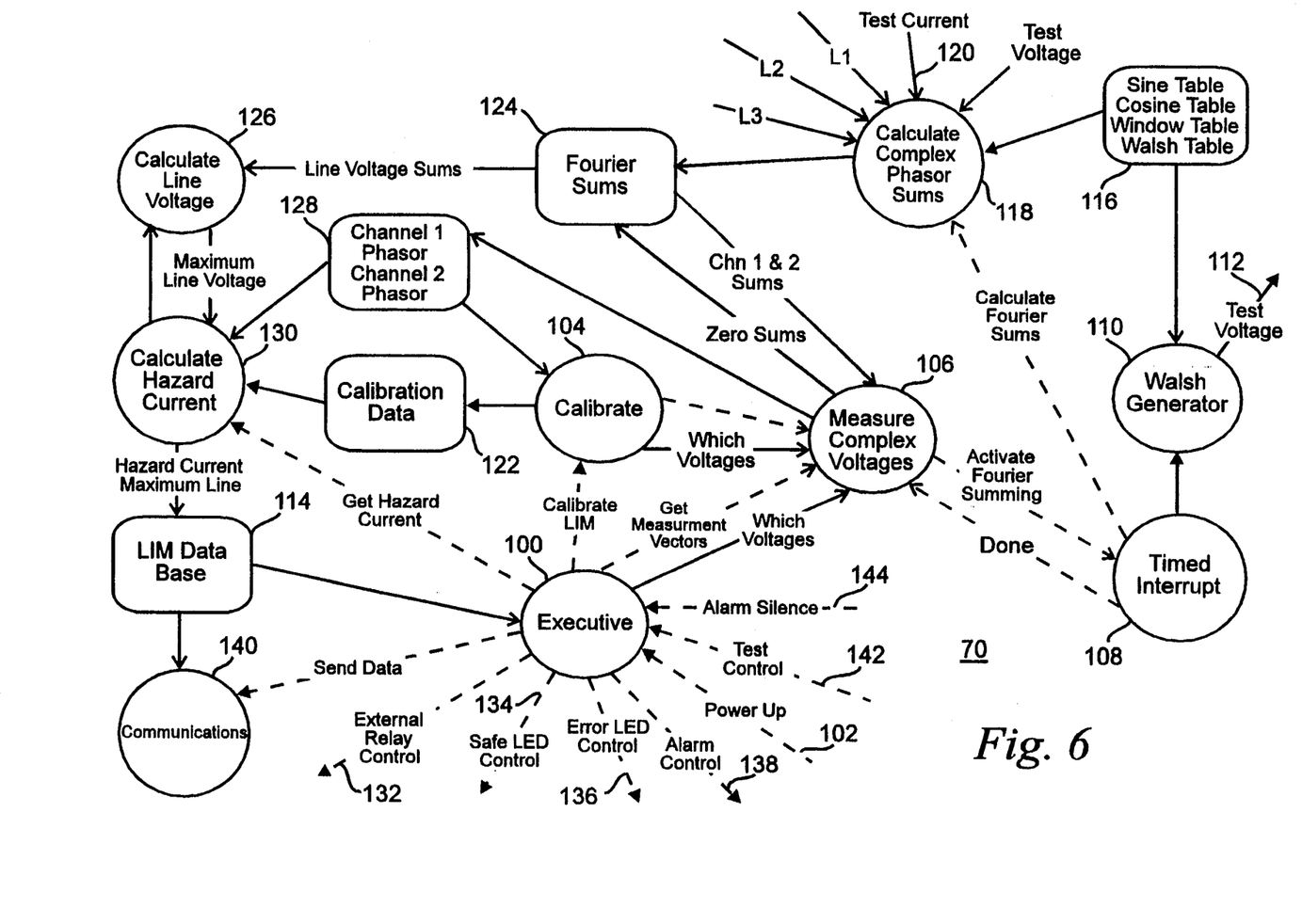
FIG. 6 is a software data flow diagram illustrating important elements in the architecture of the microcontroller of the line isolation monitor as depicted in FIG. 3.

FIG. 6 details the software data flow within microcontroller 70 to illustrate important elements in the architecture of the microcontroller 70. The executive program 100 directs and controls all functions within DLIM 15. Upon receiving a power-up signal 102, the executive 100 will start the power-up sequence which requires a calibration sequence 104 and voltage measurements 106 of the line voltages of an ungrounded system 10 and test voltages previously described. Operation of the microcontroller 70 is under the influence of timed interrupts 108 which controls the Walsh generator 110 for producing the test voltage 112 having a frequency that is a multiple of the line frequency. The line frequency is determined from zero voltage crossings of a sample of the L1 and L2 line voltages and is stored in the LIM data base 114. Walsh generator 110 uses data from tables 116 for constructing the sine wave test voltage 112. These tables are also used by calculation routine 118 to determine the amplitude and phase of the complex voltages representing the values of line voltages L1-L3, the test current 120 injected into the ground connection, and the test voltage 112. This is done using a digital signal processing method employing discrete Fourier transforms. The executive 100 controls and directs the particular parameter that is being measured. The calibration sequence 104 will verify that tolerances for the various circuit elements are within specified limits and will maintain data in a location 122 for use in calculating the hazard current and during calibration cycles that are periodically conducted when the microcontroller 70 is placed on-line.

After power up, the microcontroller 70 is placed on-line to continuously monitor the hazard current of the ungrounded system 10. The executive 100 will request a measurement of the line voltages L1-L3 and the test voltages 112 to calculate Fourier sums 124 representing the complex values of the voltages. These values are used to calculate the maximum line voltages by calculation routine 126. Calculation routine 106 calculates the test voltage and current 120 and stores the result in storage 128. Calculation routine 130 uses the test voltage and test current from storage 120 to calculate the hazard impedance using Ohms law. Knowing the hazard impedance and the maximum line voltage, the hazard current is calculated by calculation routine 130, again using Ohms law, and is stored in the data base 114 where the executive can readily access it for comparison with the threshold level setting.

The executive 100 also controls several external devices that provide visual, audio, and electrical information regarding the status of the ungrounded system. If the hazard current is below a preset level, the executive sends control signals to external relay 132 for keeping it deenergized and to turn-on SAFE LED 134. When the hazard current exceeds the preset level, it energizes the external relay 132, turns off the SAFE LED 134, turns on an ERROR LED 136 and energizes an audio alarm 138. Executive 100 provides control for a communications routine 140 which selects data from the data base 114 for outputting from a serial data communications port and an infrared optical port. In addition to a calibration of the system during power-up, the executive 100 will order a calibration routine 104 if a test control 142 is activated. This signal will force the power-up routines to restart and calibrate the system. Standards set by NFPA require that line isolation monitors be tested periodically, at least once a month and this input will provide that function. The standards also require that the hazard current be displayed continuously. The executive 100 will command that the hazard current be measured and calculated at least every five seconds. Under control of the executive 100, there will be an automatic self-calibration routine running essentially concurrent with the hazard current determination. This routine will test each parameter separately, at one minute intervals, while maintaining the continuous monitoring of the line hazard current. The test control 142 will also provide a means of debugging and testing the DLIM 15 to facilitate troubleshooting. While the specific embodiments have been illustrated and described, numerous modifications are possible without departing from the scope or spirit of the invention. For instance instead of injecting a known test current into the ground terminal, a constant test voltage applied through a known resistance could be utilized to provide a similar function. It is readily apparent that all of the electronic circuitry is adaptable for integration as an ASIC chip. Although in the foregoing embodiments have been applied to single and three phase systems, it will be clearly understood that the invention is equally applicable to polyphase systems.

We claim:

1. A system for measuring line to ground impedance between line conductors of an ungrounded polyphase power distribution system and an isolated ground, said system comprising;
   A. a frequency detector for determining a line frequency of said distribution system;
   B. a current generator for injecting a test current into said isolated ground, said test current having a frequency at a multiple of said line frequency;
   C. a current to voltage converter for generating a signal proportional to said test current;
   D. a first voltage detector for generating a first voltage proportional to a voltage measured between a first of said line conductors and ground, said voltage comprising the sum of a line voltage V1 with respect to said ground, said voltage V1 has a frequency equal to said line frequency, and a test voltage VT1 generated by said test current across a fault impedance between said line conductor and said isolated ground, said test voltage VT1 having a frequency equal to said test current frequency;
   E. a second voltage detector for generating a second voltage proportional to a voltage measured between a second of said line conductors and ground, said voltage comprising the sum of a line voltage V2 with respect to said ground, said voltage V2 having a frequency equal to said line frequency and a 180 degree phase relationship with voltage V1, and a test voltage VT2 generated by said test current across a hazard impedance between said line conductor and said isolated ground, said test voltage VT2 having a frequency equal to said test current frequency and in phase with voltage VT1;
   F. a summer for adding said first and second voltages to generate a composite signal consisting of said test voltages VT1 and VT2 and said line voltages V1 and V2 from said first and second conductors, wherein said test voltages VT1 and VT2 are in phase and add and said line voltages V1 and V2 are 180 degrees out of phase and subtract, increasing signal to noise ratio between said test voltages and said line voltages;
   G. a frequency selective voltmeter to separate said test voltages VT1 and VT2 from said composite signal to generate a signal VT proportional to said test voltages; and
   H. a divider for calculating said line to ground impedance by dividing said signal VT by said signal proportional to said test current.

2. The system for measuring line to ground impedance of claim 1 further including a microcontroller, said microcontroller functioning as said frequency detector, summer, frequency selective filter, and divider.

3. The system for measuring line to ground impedance of claim 2 wherein said microcontroller further generates a precision sine wave signal, said sine wave signal having a frequency at said multiple of said determined line frequency and wherein said current generator includes a voltage to current converter for modulating a voltage signal derived from said distribution system with said precision sine wave signal and with a current source to generate said test current, said precision sine wave signal for setting said frequency and an amplitude level of said test current.

4. The system for measuring line to ground impedance of claim 2 wherein said current generator includes means for self-configuring for operation with different voltage ratings from said distribution system, said self-configuring to maintain essentially the same amplitude level of said test current at the different voltage ratings to allow for a greater resolution of said line to ground impedance at lower test current levels.

5. The system for measuring line to ground impedance of claim 4 wherein said microcontroller includes means for adjusting amplitude of said precision sine wave signal to maintain said same amplitude level of said test current at said different voltage ratings.

6. The system for measuring line to ground impedance of claim 2 wherein said first and second voltage detectors include a frequency selective voltmeter having a center frequency selectively tuned to said line frequency when measuring said line voltages to ground and tuned to said test current frequency when measuring said test voltages and said test current, said frequency selective voltmeter including a digital signal processing method using Fourier transforms for calculating real and imaginary components of said voltages using the equations;

$$\text{REAL PART} = K \sum_{0}^{n} Vn \, \text{SIN}(\theta)$$

and

-continued $$\text{IMAGINARY PART} = K \sum_{0}^{n} V_n \cos(\theta)$$

where $V_n$ is the value of said voltage being measured at position $\Theta$ in a cycle.

7. The system for measuring line to ground impedance of claim 6 wherein said frequency selective voltmeter includes a modified Kaiser-Bessel window function to reduce spectral leakage of said Fourier transform, said Fourier transform using look-up tables to represent sine and cosine functions, said window function using discrete points on the window function to represent the window function at a given position.

8. The system for measuring line to ground impedance of claim 7 wherein said Fourier transform is a Discrete Fourier Transform function.

9. The system for measuring line to ground impedance of claim 6 wherein said divider uses said real and imaginary components of said voltages to calculate an equivalent shunt resistance and an equivalent shunt capacitance, said divider further having means for combining said shunt resistance and shunt capacitance to calculate said line to ground impedance.

10. The system for measuring line to ground impedance of claim 6 wherein said divider further including means for compensating said imaginary component measured at said test current frequency to correct said calculated line to ground impedance to said line frequency, said compensating means including multiplying said imaginary component by said multiple of said line frequency to said test frequency.

11. The system for measuring line to ground impedance of claim 1 wherein said system includes a self-calibration test on a predetermined basis to reduce or eliminate effects caused by component drift within said voltage detector and measuring circuits.

12. The system for measuring line to ground impedance of claim 11 wherein said self-calibrating test occurs upon a power-up sequence and at least once every predetermined time period, wherein said calibration during each time period is time-shared in a background mode with said line to ground impedance calculations.

13. The system for measuring line to ground impedance of claim 1 wherein said polyphase distribution system is a single phase system.

14. The system for measuring line to ground impedance of claim 1 wherein said polyphase distribution system is a three phase system.

15. A system for measuring line to ground impedance by a microcontroller-based line isolation monitor for continuously displaying a hazard current between line conductors of an ungrounded polyphase power distribution system and an isolated ground, said system comprising;
   A. means for determining line frequency of said distribution system;
   B. means for injecting a test current into said isolated ground, said test current having a frequency at a multiple of said line frequency, said injecting means further for generating a signal proportional to said test current;
   C. means for measuring a test voltage and a line voltage between each of said line conductors and said isolated ground, said test voltage responsive to said test current;
   D. means for calculating a hazard impedance by dividing said measured test voltage by said signal proportional to said test current for each of said line conductors;
   E. means for compensating said calculated hazard impedance to correct for frequency dependent differences of said hazard impedance at said test current frequency and said line frequency; and
   F. means for periodically self-calibrating said line isolation monitor.

16. The system for measuring line to ground impedance of claim 15 further including means for generating a precision sine wave signal, said sine wave signal having a frequency at said multiple of said determined line frequency and said sine wave signal for setting frequency of said test current at said multiple of said line frequency.

17. The system for measuring line to ground impedance of claim 15 wherein said measuring means includes a frequency selective voltmeter having a center frequency selectively tuned to said line frequency when measuring said line voltages to ground and tuned to said test current frequency when measuring said test voltages, said frequency selective voltmeter including a digital signal processing method using Fourier transforms for calculating real and imaginary components of said voltages and wherein said real components of said voltages are used to calculate an equivalent shunt resistance and said imaginary components of said voltages are used to calculate an equivalent shunt capacitance by said hazard impedance calculating means.

18. The system for measuring line to ground impedance of claim 17 wherein said Fourier transform is a Discrete Fourier Transform function.

19. The system for measuring line to ground impedance of claim 15 further including means for changing said multiple of said determined line frequency and thereby said test current frequency, said means for also changing said center frequency of said frequency selective voltmeter to equal said changed multiple when measuring said test voltages, said changing means to allow multiple monitors set to different multiples of line frequencies to be connected on the same power distribution system.

20. The system for measuring line to ground impedance of claim 15 wherein said periodical calibration means performs a calibration upon a power-up sequence and at least once every predetermined time period, wherein said calibration during each time period is time-shared with said hazard current calculations so as to provide continuous display of said hazard current during calibration.

21. The system for measuring line to ground impedance of claim 15 wherein said polyphase distribution system is a single phase system.

22. The system for measuring line to ground impedance of claim 15 wherein said polyphase distribution system is a three phase system.

* * * * *